(12) United States Patent
Durney et al.

(10) Patent No.: US 7,355,861 B2
(45) Date of Patent: Apr. 8, 2008

(54) CARD GUIDE FOR MOUNTING PRINTED CIRCUIT BOARDS AND THE LIKE TO ELECTRONIC EQUIPMENT HOUSINGS

(75) Inventors: Max W. Durney, San Francisco, CA (US); Joseph C. Cardona, San Francisco, CA (US); Chien (Ryan) Lam, San Francisco, CA (US); William H. Schnoebelen, San Francisco, CA (US)

(73) Assignee: Industrial Origami, Inc., San Francisco, CA (US)

( * ) Notice: Subject to any disclaimer, the term of this patent is extended or adjusted under 35 U.S.C. 154(b) by 0 days.

(21) Appl. No.: 11/272,472

(22) Filed: Nov. 9, 2005

(65) Prior Publication Data

US 2006/0215378 A1    Sep. 28, 2006

Related U.S. Application Data

(60) Provisional application No. 60/626,748, filed on Nov. 10, 2004.

(51) Int. Cl.
*H05K 7/14* (2006.01)
(52) U.S. Cl. ............... 361/756; 361/741; 361/802
(58) Field of Classification Search ........... 361/741, 361/756, 802, 759, 747, 801
See application file for complete search history.

(56) References Cited

U.S. PATENT DOCUMENTS

| | | | |
|---|---|---|---|
| 3,878,438 A * | 4/1975 | Weisman | 361/802 |
| 4,327,835 A * | 5/1982 | Leger | 211/41.17 |
| 5,737,226 A * | 4/1998 | Olson et al. | 701/224 |
| 6,728,114 B2 * | 4/2004 | Serjack et al. | 361/802 |
| 7,099,160 B1 * | 8/2006 | Ice | 361/802 |
| 7,167,380 B2 * | 1/2007 | Ice | 361/796 |

* cited by examiner

*Primary Examiner*—Tuan T Dinh
*Assistant Examiner*—Dameon E Levi
(74) *Attorney, Agent, or Firm*—Morgan, Lewis & Bockius LLP; David J. Brezner; Victor E. Johnson (57) ABSTRACT

A card guide for mounting printed circuit boards, electronic pathway or component carrying cards, or the like, to an electronic equipment housing having a wall with a pair of openings formed to receive mounting feet provided on the card guide. The card guide body includes a card-receiving guideway on an inwardly facing side of the body and a card mounting structure on the outwardly facing side of the body. The card mounting structure preferably includes L-shaped posts or feet having longitudinally extending portions which enable the card guide to be inserted through an opening in a housing wall to a position in which the L-shaped feet interlock with the housing wall adjacent to the openings. Most preferably the card guide body is resiliently flexible and can be bowed to allow insertion into pairs of mounting openings and will spring back once inserted to secure the card guide to the housing wall. Embodiments suitable for mounting the card guide to a single housing wall or a sandwich of two abutting housing walls are disclosed.

23 Claims, 4 Drawing Sheets

CARD GUIDE FOR MOUNTING PRINTED CIRCUIT BOARDS AND THE LIKE TO ELECTRONIC EQUIPMENT HOUSINGS

CROSS-REFERENCES TO RELATED APPLICATIONS

This application claims priority to U.S. Provisional Patent Application No. 60/626,748 filed Nov. 10, 2004, entitled CARD GUIDE FOR MOUNTING PRINTED CIRCUIT BOARDS AND THE LIKE TO ELECTRONIC EQUIPMENT HOUSINGS, the entire contents of which is incorporated herein by this reference.

TECHNICAL FIELD

The present invention relates, in general, to mounting structures for mounting printed circuit boards or electronic component-supporting cards to the housings or chassis of electronic equipment, and more particularly, relates to a card guide structure which slidably receives a card or printed circuit board and mounts the same to an equipment housing.

BACKGROUND ART

Electronic housings or enclosures typically include card guides on opposed spaced apart walls into which a printed circuit boards, or similar cards, can be slidably mounted and supported to form various electronic apparatus. Most typically, such card guides have elongated bodies with inwardly facing channels that are mounted in pairs inside the equipment housing and slidably receive the printed circuit boards. On an outwardly facing side of the card guide, barbed posts have previously been provided that can be urged into openings or holes in the housing so as to secure the card guides to the housing.

Figure 1:
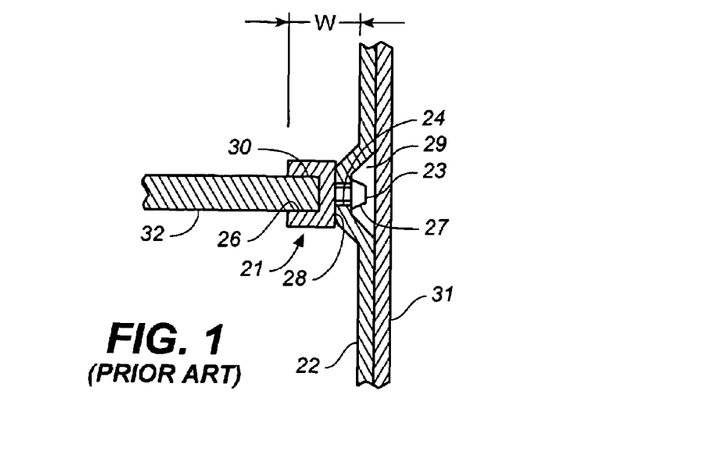
FIG. 1 is a fragmentary, side elevation view, in cross section of a typical card guide and electronic housing wall section of the type found in the prior art.

FIG. 1 illustrates a typical prior art card guide and housing assembly. As shown in FIG. 1, an elongated card guide, generally designated 21, is shown mounted to a housing wall member 22 by a post 23 which extends through an opening 24 in housing wall 22. As will be seen, guide 21 generally has a C-shaped transverse cross section defining a channel or guideway 26 dimensioned to receive an edge 30 of a printed circuit board or similar electronic card 32. Post 23 will be formed with a barbed or laterally projecting or enlarged head 27, which can be urged through opening 24 with the barb snaps in behind the back surface of housing wall 22 so as to secure guide 21 to wall 22. Most typically, wall 22 is inwardly embossed at 28 so as to provide a space 29 which will receive the enlarged head of post 23. Usually a second wall 31 is mounted in abutting relation to wall 22 to complete the assembly, with the second wall advantageously providing an electromagnetic interference, EMI, shield. Second wall 31 also insures equipment is smooth. In some instances, outer wall 31 is not provided, and in still other embodiments, the inwardly embossed area 28 is not provided so that the post merely extends beyond wall 22.

One of the problems with such prior art card guide mounting schemes is that enlarged head 27 on post 23 can be sheered off during insertion of the post through opening 24, which is often punched in sheet metal that usually is employed as wall 22. Thus, the card guide will no longer be positively held in hole 24 by a barb or enlarged post head, and the guide is free to back out of the hole, for example, during an attempted assembly of the printed circuit board into the guide. As will be understood, printed circuit board 32 is held at an opposite side thereof by a similar, oppositely facing, card guide (not shown), with the printed circuit board being slid longitudinally along the pair of card guides during fabrication of the electronic assembly. As also can be seen from FIG. 1, the distance or width, W, between the outside edge of the card guide 21 and the inwardly facing surface of wall 22 is lost as far as being available for electronic components or pathways on printed circuit board 32. Since this lost area occurs on both edges of the printed circuit board and over the entire length of the board, there is an area, equal to twice this width dimension W times the length of the printed circuit board, that cannot be used for electronic circuitry as a result of the structure by which the printed circuit board or card 32 is held by prior art card guides.

Accordingly, it is an object of the present invention to provide a card guide for a printed circuit board, electronic component card or the like, which has an improved structure for mounting of the guide to a wall of an electronic housing or chassis and thus an improved structure for mounting the card inside the housing.

Another object of the present invention is to provide a printed circuit board mounting card guide which is more positively and reliably mounted to the wall or chassis of an electronic apparatus and which increases the usable area available for electronic components and pathways on the printed circuit board for any given width between opposed housing walls.

Still a further object of the present invention is to provide a card guide for printed circuit boards or the like which is easy to mount to an electronic equipment housing wall or chassis frame.

Still another object of the present invention is to provide a card guide for a printed circuit board or card which is easy and inexpensive to manufacture, can be installed without special tools, and is durable.

The card guide and electronic equipment housing assembly of the present invention have other objects and features of advantage which will become apparent from, and are set forth in more detail in, the accompanying drawings and the following description of the Best Mode of Carrying Out the Invention.

SUMMARY OF THE INVENTION

One aspect of the present invention is directed to a card guide for mounting printed circuit boards and the like to an electronic equipment housing. The card guide includes an elongated card guide body having a card-receiving guideway on an inwardly facing side of the card guide body, and a card guide mounting structure on an outwardly facing side of the card guide body, the card guide mounting structure including a pair of spaced apart mounting feet dimensioned to be inserted through spaced apart mating openings in a wall of the electronic housing. The mounting feet are formed to cooperate with the openings in the housing so as to positively secure the guide to the housing wall.

The length and width dimensions of the mounting feet may be no greater than the length and width dimensions of the mating openings. The card guide body may be resiliently flexible so that the card guide body can be bowed about a vertical axis and allowing the mounting feet to be inserted into the spaced apart openings in the wall of the housing, wherein, once inserted, the card guide body resiliently springs to an extended position thereby trapping the mounting feet behind the wall of the housing. The card guide may be bowed inwardly in a relaxed state and whereby may be flexed outwardly for insertion, after which it resiliently springs inwardly to trap the mounting feet behind the wall of the housing.

The mounting feet may be L-shaped feet having ends extending substantially parallel with a longitudinal axis of the card guide body, wherein the ends may be dimensioned to be inserted through spaced apart mating openings in a wall of the housing. The ends may extend in the same direction or in opposite directions. The card guide body may be resiliently flexible so that the card guide body can be bowed about a vertical axis and inserted into spaced apart openings in the wall of the housing, wherein, once inserted, the card guide body resiliently springs to an extended position thereby trapping the mounting feet behind the wall of the housing. The card guide may be bowed inwardly in a relaxed state and whereby may be flexed outwardly for insertion, after which it resiliently springs inwardly to trap the mounting feet behind the wall of the housing. The card guide body may include indexing projections located intermediate the mounting feet Another aspect of the present invention is directed to an electronic equipment chassis for supporting printed circuit boards and the like thereon. The chassis includes an inner wall, a pair of spaced apart inner openings in the inner wall, and a card guide for mounting printed circuit boards and the like to the electronic equipment chassis. The card guide includes an elongated card guide body having a card-receiving guideway on an inwardly facing side of the card guide body, and a card guide mounting structure on an outwardly facing side of the card guide body, the card guide mounting structure including a pair of spaced apart mounting feet dimensioned to be inserted through the spaced apart openings in the inner wall of the electronic chassis. The mounting feet may be formed to cooperate with the inner openings in the chassis so as to positively secure the guide to the inner wall.

The length and width dimensions of the mounting feet may be no greater than the length and width dimensions of the inner openings. The card guide body may be resiliently flexible so that the card guide body can be bowed about a vertical axis and allowing the mounting feet to be inserted into the inner openings in the wall of the chassis, wherein, once inserted, the card guide body resiliently springs to an extended position thereby trapping the mounting feet behind the inner wall of the chassis. The card guide may be bowed inwardly in a relaxed state and whereby may be flexed outwardly for insertion, after which it resiliently springs inwardly to trap the mounting feet behind the inner wall of the chassis.

The mounting feet may be L-shaped feet having ends extending substantially parallel to the inner wall, wherein the ends may be dimensioned to be inserted through spaced apart mating openings in the inner wall of the chassis. The card guide body may be resiliently flexible so that the card guide body can be bowed about a vertical axis and inserted into spaced apart inner openings in the wall of the chassis, wherein, once inserted, the card guide body resiliently springs to an extended position thereby trapping the mounting feet behind the inner wall of the chassis. The card guide may be bowed inwardly in a relaxed state and whereby may be flexed outwardly for insertion, after which it resiliently springs inwardly to trap the mounting feet behind the inner wall of the chassis. The inwardly extending projection extending from at least one of the ends, and a projection opening located adjacent a respective one of the inner openings. The inwardly extending projection may be dimensioned and configured to engage the projection opening to resiliently latch the card guide to the inner wall.

The chassis may further include an indexing projection on the card guide body located intermediate the mounting feet, and an indexing opening on the inner wall dimensioned and configured to receive the indexing projection. The indexing projection may engage the indexing opening once the mounting feet have been inserted through the inner openings thereby limiting relative movement between the card guide and the inner wall. Also, the chassis may further include an outer wall adjacent and parallel to the inner wall, the outer wall being longitudinally shiftable to the inner wall, and a pair of spaced apart outer openings the outer wall, the outer openings having substantially the same dimensions and configuration as the inner openings. The mounting feet may be trapped between the longitudinally shifted inner and outer openings in the inner and outer walls so that the feet hold the card guide between a sandwich configuration between the inner and outer walls.

DETAILED DESCRIPTION OF THE INVENTION

Reference will now be made in detail to the preferred embodiments of the invention, examples of which are illustrated in the accompanying drawings. While the invention will be described in conjunction with preferred embodiments, it will be understood that they are not intended to limit the invention to these embodiments. To the contrary, the invention is intended to cover alternatives, modifications and equivalents, which may be included within the spirit and scope of the invention, as defined by the appended claims.

Turning now to FIGS. 2-5, a card guide for printed circuit board, electronic circuit supporting substrate, or electronic component-carrying card is shown, together with a section of electronic housing wall. The card guide of the present invention, generally designated 41, includes an inwardly or facing guideway 42 formed and dimensioned to slidably receive a printed circuit board 43, or the like. Card 43 is held between a pair of guideways 42 mounted to opposed walls, such as wall 44, on opposite sides of an electronic housing or chassis. Thus, a second similar assembly (not shown) is provided facing in an opposite direction on the other side of the housing for support of an opposite edge of card 43. Guideway 42 can advantageously include tapered entrance surfaces 46 which facilitate inserting printed circuit board 43 into guideway 42 and sliding the board longitudinally along the elongated guideway 42 until it has been fully mounted between a pair of card guides 41. Elongated printed circuit board channel 42 need not be continuous over its entire length, but it should have board supporting surfaces sufficiently frequently along the lengths so that the printed circuit board will be held in place once it is slid in the longitudinal direction as indicated by arrow 47 in FIG. 2 down the guideway channel 42. As will be understood, the transverse spacing across the housing between channels 42 is such that board or card 43 is trapped between the two card guide channels. As thus far described, guideway 41 is constructed in the same manner as guideway 21 in the prior art.

Figure 2:
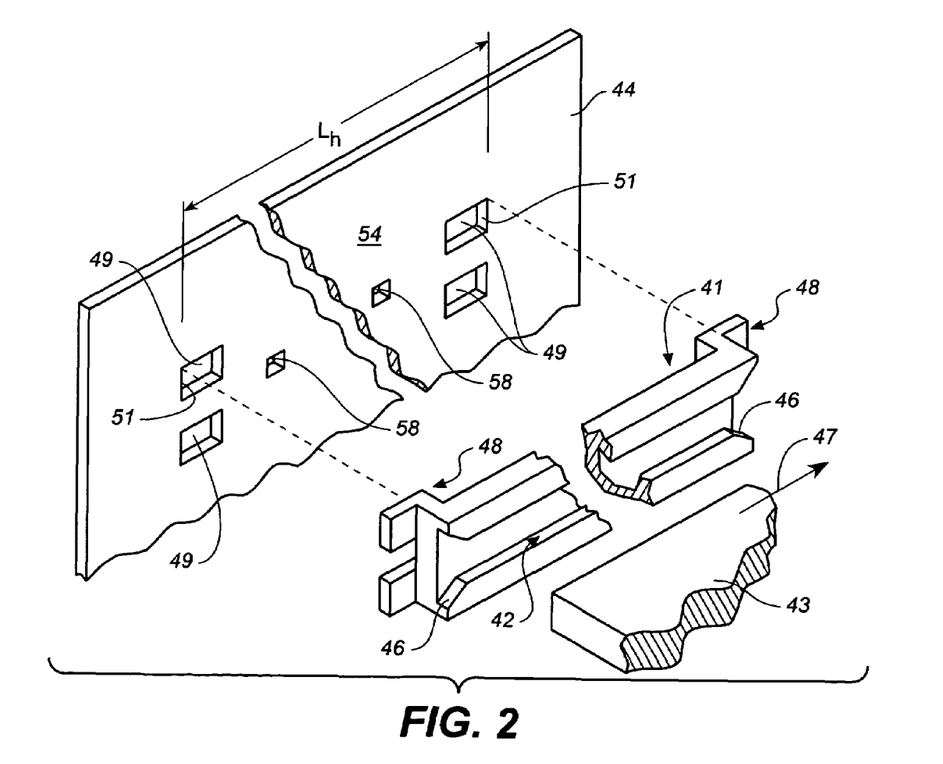
FIG. 2 is a top perspective view of a card guide and housing wall prior to assembly and constructed in accordance with the present invention.

In order to secure card guide 41 to housing wall 44, the card guide of the present invention is provided with spaced apart feet or L-shaped posts, generally designated 48, that are formed to cooperate with and be inserted into feet-receiving openings or holes 49 in housing wall 44. As will be seen, both card guide 41 and wall 44 are broken away, indicating that both the wall and card guide can be of various lengths, with the obvious further requirement that the longitudinal spacing between openings 49 be matched or mated to longitudinal distance between L-shaped posts or feet 48, as described in more detail below.

Figure 3:
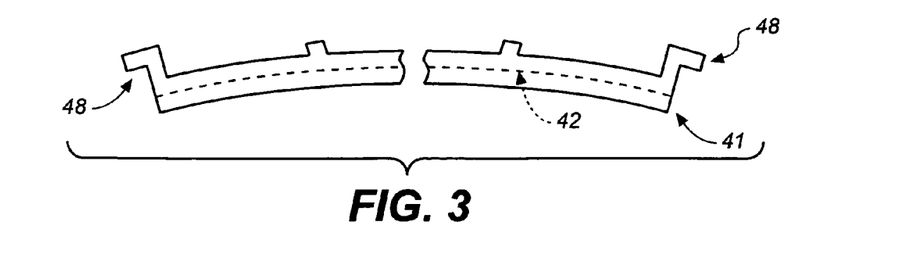
FIG. 3 is a top plan view of the card guide of FIG. 2 in a relaxed condition prior to mounting to the housing wall.

In its most preferred form, card guide 41 will be formed of a resiliently flexible material such as a plastic or metal, which is biased to bow in an inward direction relative to housing wall 44 in its relaxed state, as best may be seen in FIG. 3. As used herein, the expression "inward" shall mean a card guide body which is bowed as shown in FIG. 3 in a direction which extends inwardly from wall 44 of the housing toward the opposite housing wall. Thus, guide 44 in a relaxed state and without any forces being applied to it will assume the slightly bowed or flexed condition in shown in FIG. 3.

Figure 4:
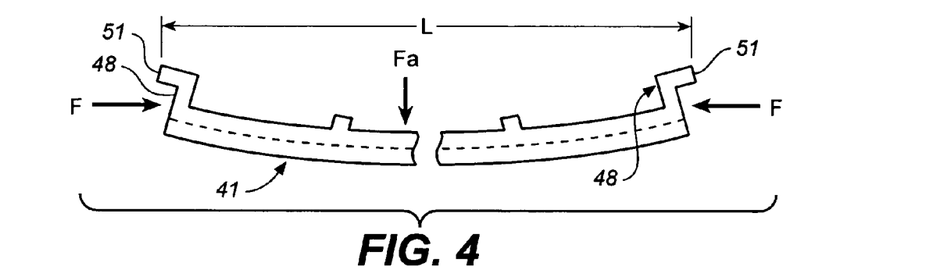
FIG. 4 is a top plan view corresponding to FIG. 3 of the card guide as it is flexed to permit insertion into the housing wall openings shown in FIG. 2

In order to mount card guide 41 to wall 44, forces F can be applied to the ends of card guide body while an auxiliary force at $F_a$ is applied transversely of the length of the card guide to cause it bend or bow to the condition shown in FIG. 4. Since the card guides are relatively long and elongated, such bowing or flexing in the direction opposed to the relaxed state of FIG. 3 is relatively easily accomplished, and the bowing of the card guide body should be sufficient that the ends 51 of the card guide will be separated by a length dimension L which is slightly less than the length dimension $L_h$ between the outside edges 51 of holes or openings 49 in housing wall 44, as best may be seen in FIGS. 2 and 5. Once L is slightly less than $L_h$, feet 48 can be inserted into openings 49, which have a longitudinal dimension along card guide 41 sufficient to allow the longitudinal dimension of feet 48 to pass therethrough. It will be understood that once bowed to the condition of FIG. 4, the force $F_a$ can be released and the forces F simply maintained during the insertion process.

Figure 5:
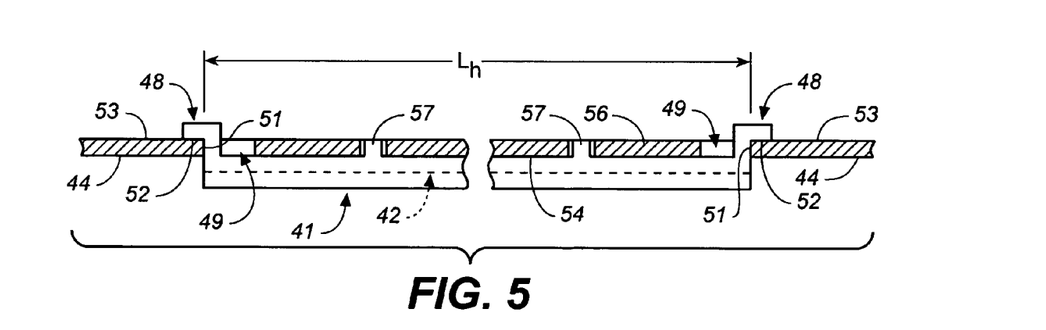
FIG. 5 is a top plan view, in cross section, of the assembly of FIG. 2 after the card guide is mounted to the housing wall.

Once feet 48 of card guide 41 are inserted into openings 49, the forces F can be released, and the card guide will resiliently spring back toward its position as shown in FIG. 3. The inner surfaces 52 of the feet will then engage the outwardly facing side 53 of wall 44 while the central body will flex back against and abut surface 54 of wall 44, causing guide 41 to abut wall 44 over substantially its entire length. This result is shown in FIG. 5 where the resilient card guide body has bowed or flexed back into a abutting engagement with wall 44. It will apparent to one skilled in the art that the distance between surface 52 of the feet and interior side 56 of the card guide body, most preferably will be substantially equal to the thickness of wall 44.

In the most preferred form of the housing wall and card guide assembly, the card guide further is provided with indexing posts 57 which are positioned and dimensioned so as to be automatically inserted into indexing openings 58 in wall 44 when the card guide body springs back toward its relaxed condition. These posts further secure card guide 41 against displacement relative to wall 44. As shown, both posts 57 and openings 52 are rectangular in shape, but it will be understood that they also could be cylindrical.

As will be understood from the above, therefore, card guide 41 can be easily mounted to an electronic component housing or chassis by simply bowing or flexing the guide, inserting it into mounting openings, and thereafter releasing it so that the resilient body will cause the guide to snug down tightly against housing wall 44.

It will also be understood that card guide 41 need not have an inward bow as shown in FIG. 3 as the initial relaxed condition. Thus, if the guide body is essentially just planar over its length, as shown in FIG. 2, it can be bowed to a position as shown in FIG. 4, and the card body will tend to resume a planar position and be pulled down against wall 44. The feet or L-shaped posts 48 will again secure the guide positively in slots 49. The approach of flexing the entire length of the card guide body require less stress than occurs when forcing a relatively short barb or enlarged head through a closely dimensioned mounting opening or hole.

Figure 6:
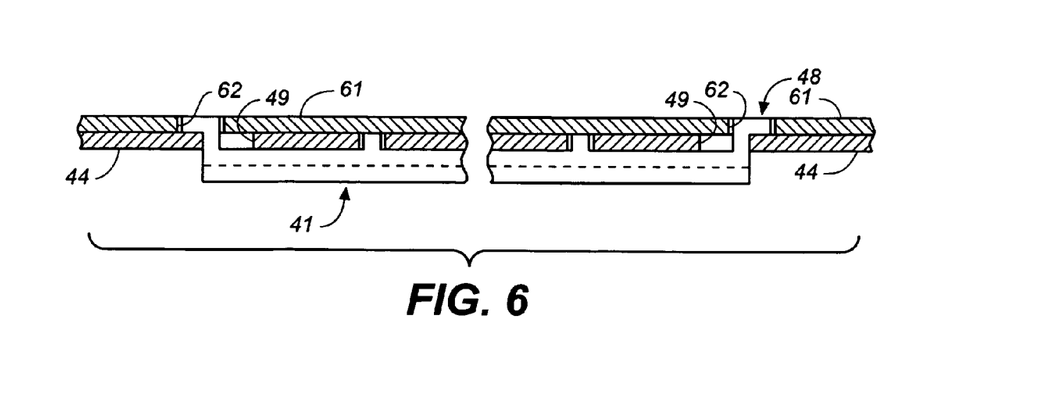
FIG. 6 is an assembly corresponding to FIG. 5 but showing an alternative embodiment in which a second housing wall is mounted in abutting relation to an outwardly facing side of the wall of FIG. 5.

As will be seen from FIG. 5, however, the L-shaped posts or feet 48 do extend beyond outer surface 53 of housing wall 44. This is acceptable for many applications, but in some cases it is preferable that surface 53 be continuous and smooth. Moreover, there is some potential for the openings 49 to allow the escape of electromagnetic radiation. In FIG. 6, therefore, an alternative embodiment of the assembly of FIG. 5 is shown in which a second wall 61 has been positioned in abutting relation to wall 44 on the outside of the assembly. Wall 61 has openings 62 therein dimensioned to receive the transversely extending feet 48. As will be seen, however, there is a longitudinal staggering between openings 49 in wall 44, as compared to openings 62 in wall 61 so that the EMI protection also will be improved by adding a second abutting wall 61. The outside surface of the assembly also is now smooth, since the thickness of wall 61 and the thickness of feet 48 will be substantially the same.

Figure 7:
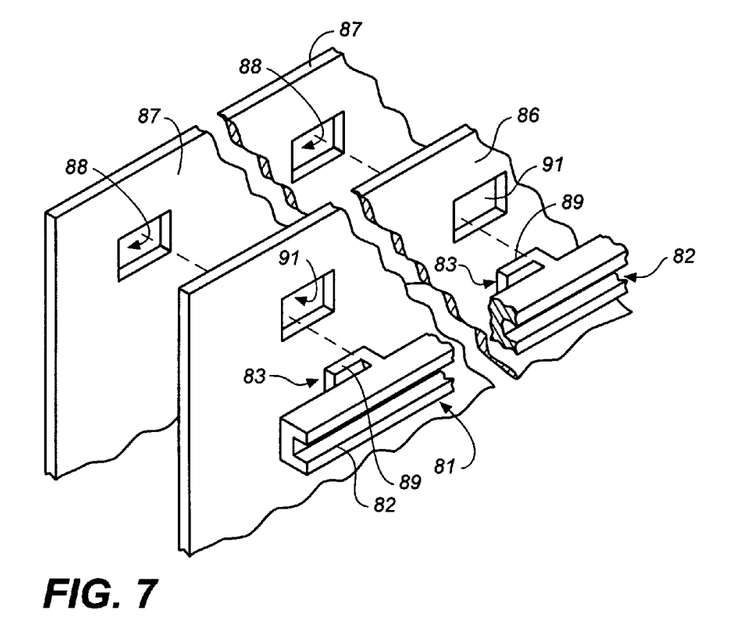
FIG. 7 is a fragmentary top perspective view of an alternative embodiment of the card guide and electronic housing wall assembly of FIG. 2.
Figure 8:
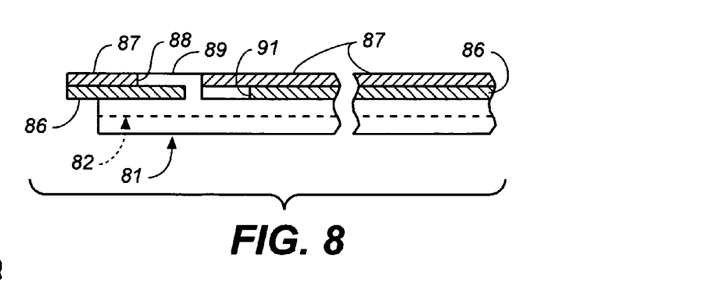
FIG. 8 is a fragmentary top plan view, in cross section, of the assembly of FIG. 7 with the card guide shown mounted between two housing walls.

Referring now to FIGS. 7 and 8, an alternative embodiment of the card guide and the equipment housing assembly of the present invention is shown. In this embodiment card guide 81 is again formed with a guideway or channel 82 dimension to slidably receive a printed circuit board or card (not shown). Extending from an outwardly facing side of card guide 82 are a pair of feet or L-shaped posts 83 which are used to mount card guide 81 to abutting housing walls 86 and 87.

The outermost wall 87 of the equipment housing is formed with openings 88 which are dimensioned to receive the transversely extending foot portions 89 of the L-shaped post or feet 83. This can be seen in FIG. 8 wherein the transversely extending foot portion 89 can be seen to substantially fill and be in close mating engagement with opening 88. Formed in interior wall 86 are another set of openings 91 which are dimensioned to receive feet 83 therethrough, as best seen in FIG. 8. Openings 91 are longitudinally staggered or displaced relative to openings 88, and since it will be seen that the longitudinally extending portions 89 of feet 83 extend in the same direction from the feet or posts, openings 91 are similarly staggered longitudinally in the same direction in housing wall 86.

Mounting of card guide 81 to walls 86 to 87 of the electronic equipment housing is accomplished by first inserting the feet 83 through openings 91 until the longitudinally extending portions 89 are past the back surface of wall 86. The card guide and wall 86 are moved relative to each other to the position shown in FIG. 8 with the horizontal portion of the mounting foot now extending behind housing wall 86 so as to positively prevent withdrawal of card guide 81 out through opening 91. Next, the outer wall 87 is mounted over longitudinally extending foot portion 89 and is preferably in close sliding engagement therewith so as to be effective as an EMI shield. Outer wall 87 will be seen to block most of opening 91 that is not filled with the post or foot 83. The two walls 86 and 87 are held together against separation by other structures such as fasteners and/or end walls of the overall electronic equipment housing. As so held together, card guide 81 is sandwiched between the two walls and cannot escape back out openings 91.

Figure 9:
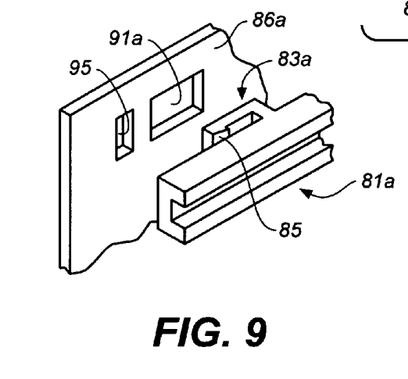
FIG. 9 is a fragmentary top perspective view of a further alternative embodiment of the L-shaped card guide posts or mounting feet.
Figure 10:
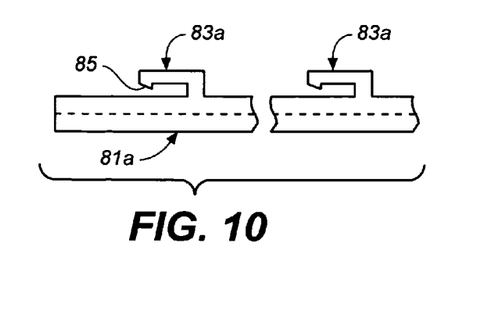
FIG. 10 is a top plan view of the alternative embodiment of the card guide of FIG. 9.

FIGS. 9 and 10 illustrate an alternative embodiment which can be used in an assembly such as shown in FIGS. 7 and 8. In FIGS. 9 and 10 the card guide 81a is provided with at least one foot 83a which has in inwardly projecting end 85 which can be used to resiliently latch card guide 81a to a single wall 86a. The housing wall 86a is formed with an opening 91a in a manner similar to that of opening 91 in the embodiment of FIGS. 7 and 8. In addition, a second opening 95 is provided in a longitudinally adjacent area of wall 86a. Opening 95 is dimensioned to receive the inward projection 85 of foot 83a. When the card guide is assembled to wall 86a, therefore, foot 83a is inserted through opening 91a and then shifted to the left in FIG. 9 until the inward projection 85 snaps into opening 95 so as to latch wave guide 81a to wall 86a. It would be possible, but not necessary, to have a second wall 87 behind and abutting wall 86. As shown in FIG. 10, only one of feet 83a includes an inward projection 85, but it will be understood that both feet 83a could be so formed with wall 86a having similar pair of openings 91a and 95 at an appropriate spacing from the other mounting leg.

Figure 11:
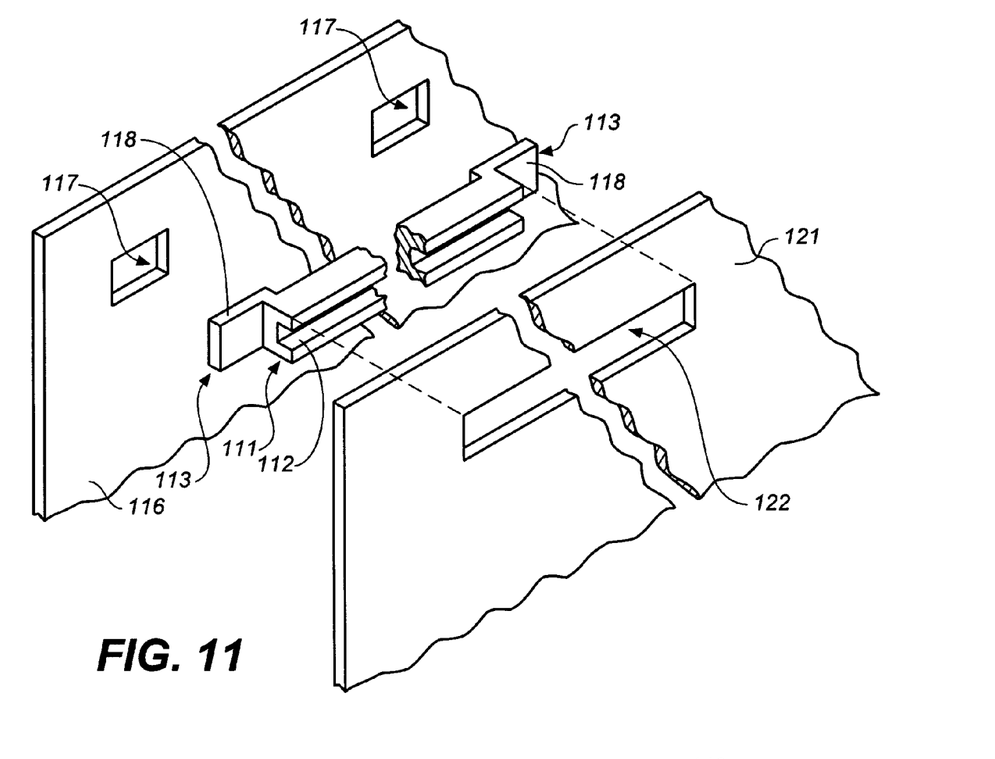
FIG. 11 is a fragmentary, top perspective view of still a further alternative embodiment of the card guide and electronic housing assembly of the present invention.
Figure 12:
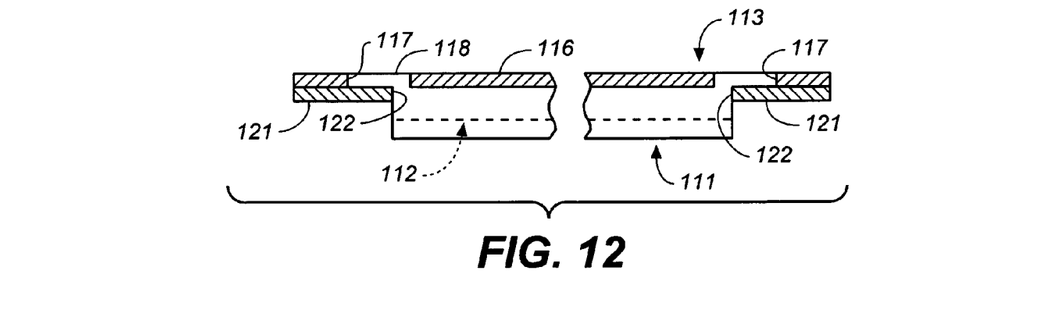
FIG. 12 is a top plan view, in cross section, of the assembly of FIG. 11.

FIGS. 11 and 12 show still a further alternative embodiment in which a card guide 111 is shown with a card or PCB board guideway 112 and mounting feet 113 on opposite ends of the guide. Housing wall 116 is formed with openings 117 therethrough dimensioned to receive the foot or longitudinally extending portion 118 of each foot 113. Again, the openings 117 and longitudinally extending foot portions 118 are preferably dimensioned for close sliding mating fit therebetween. An inner housing wall 121 is provided with an opening 122 having an area which mates with the area of guideway 111 so as to trap the feet behind wall 121, as best may be seen in FIG. 12. This assembly again requires that walls 121 and 116 be held together by a fastener or some other portion of the housing structure, such as an end wall. This dual wall assembly again presents a smooth outer side to the housing and the combination of walls acts as an EMI shield which will resist electromagnetic interference.

Figure 13:
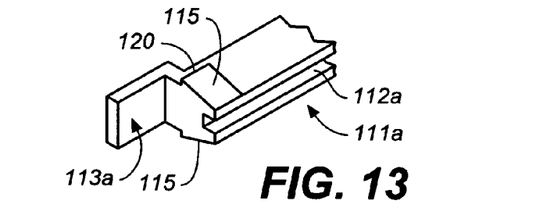
FIG. 13 is a top perspective view of another alternative embodiment of the card guide.

In FIG. 13, still a further alternative guideway 111a is shown having a card receiving guideway 112a and mounting legs or L-shaped posts 113 which can be used in an assembly such as shown in FIG. 12. In the modified form, tapered surfaces 115 can be urged through opening 122 and the outwardly facing shoulders 120 will snap upwardly and downwardly against the inwardly facing surface of wall 121 so as to further lock the assembly of the card guide to wall 121. Such an approach allows a single wall 121 to be used instead of requiring a second wall 116 which is held to the first wall 121.

The foregoing descriptions of specific embodiments of the present invention have been presented for the purposes of illustration and description. They are not intended to be exhaustive or to limit the invention to precise forms to disclosed, and obviously many modifications and variations are possible in light of the above teaching. The embodiments were chosen and described in order to best explain the principals of the invention and its practical application to thereby enable others skilled in the art to best utilized the invention various embodiments with modifications as are suited to the particular use contemplated.

What is claimed is:

1. A card guide for mounting printed circuit boards and the like to an electronic equipment housing, said card guide comprising:
    an elongated card guide body having a card-receiving guideway on an inwardly facing side of the card guide body; and
    a card guide mounting structure on an outwardly facing side of the card guide body, the card guide mounting structure including:
        a pair of spaced apart mounting feet dimensioned to be inserted through a first pair of spaced apart mating openings in a first wall of the electronic housing; and
        an inwardly projecting end provided on at least one of the feet dimensioned to be inserted into a second opening in the wall spaced from and longitudinally adjacent to the first pair of mating openings;
    wherein the mounting feet are L-shaped and extend in the same direction, and wherein the mounting feet and inwardly projecting ends are formed to cooperate with the first and second respective openings in the housing so as to positively secure the guide to the housing wall.

2. A card guide according to claim 1, wherein
    overall length and width dimensions of the mounting feet are no greater than overall length and width dimensions of the mating openings.

3. A card guide according to claim 1, wherein
    the ends extend substantially parallel with a longitudinal axis of the card guide body and are dimensioned to be inserted through spaced apart mating openings in the wall of the housing.

4. A card guide according to claim 1, wherein the inwardly projecting ends releasably snap into the second opening when the mounting feet are shifted laterally.

5. A card guide according to claim 1, wherein the second opening is discrete from the first spaced apart mating openings.

6. A card guide according to claim 1, further including a second wall behind and abutting the first wall dimensioned to receive the mounting feet in a sandwich configuration.

7. A card guide for mounting printed circuit boards and the like to an electronic equipment housing, said card guide comprising:
an elongated card guide body having a card-receiving guideway on an inwardly facing side of the card guide body;
a card guide mounting structure on an outwardly facing side of the card guide body, the card guide mounting structure including a pair of spaced apart mounting feet dimensioned to be inserted through spaced apart mating openings in a wall of the electronic housing; and
indexing projections provided on the card guide body intermediate the mounting feet and configured and dimensioned to be inserted into indexing openings spaced from and adjacent to the spaced apart mating openings;
wherein the mounting feet are formed to cooperate with the openings in the housing and the indexing projections are formed to cooperate with the indexing openings so as to positively secure the guide to the housing wall, and wherein the mounting feet are L-shaped feet having ends extending substantially parallel with a longitudinal axis of the card guide body and dimensioned to be inserted through the spaced apart mating openings in the wall of the housing.

8. A card guide according to claim 7, wherein the card guide body is resiliently flexible so that the card guide body can be bowed about a vertical axis and allow the mounting feet to be inserted into the spaced apart openings in the wall of the housing, wherein, once inserted, the card guide body resiliently springs to an extended position thereby trapping the mounting feet behind the wall of the housing.

9. A card guide according to claim 7, wherein
the card guide is bowed inwardly in a relaxed state and whereby the card guide is flexed outwardly for insertion after which it resiliently springs inwardly to trap the mounting feet behind the wall of the housing.

10. A card guide according to claim 7, wherein the ends extend in opposite directions.

11. A card guide according to claim 7, wherein
the card guide body is resiliently flexible so that the card guide body can be bowed about a vertical axis and inserted into the spaced apart openings in the wall of the housing, wherein, once inserted, the card guide body resiliently springs to an extended position thereby trapping the mounting feet behind the wall of the housing.

12. An electronic equipment chassis for supporting printed circuit boards and the like thereon, said chassis comprising:
an inner wall;
a pair of spaced apart inner openings in the inner wall; and
a card guide for mounting printed circuit boards and the like to the electronic equipment chassis, the card guide including:
an elongated card guide body having a card-receiving guideway on an inwardly facing side of the card guide body;
a card guide mounting structure on an outwardly facing side of the card guide body, the card guide mounting structure including a pair of spaced apart mounting feet dimensioned to be inserted through the spaced apart openings in the inner wall of the electronic chassis;
an outer wall adjacent to and parallel to the inner wall, the outer wall being longitudinally shiftable to the inner wall; and
a pair of spaced apart outer openings in the outer wall, the outer openings having substantially the same dimensions and configuration as the inner opening;
wherein the mounting feet are formed to cooperate with the inner openings in the chassis so as to positively secure the guide to the inner wall and wherein the mounting feet are trapped in a sandwich configuration between the inner and outer openings in the inner and outer walls.

13. The chassis according to claim 12, wherein
the mounting feet are L-shaped feet extending substantially parallel to the inner wall.

14. The chassis according to claim 12, wherein
overall length and width dimensions of the mounting feet are no greater than the overall length and width dimensions of the inner openings.

15. An electronic equipment chassis for supporting printed circuit boards and the like thereon, said chassis comprising:
an inner wall including a pair of spaced apart inner openings;
an indexing opening on the inner wall spaced from and intermediate the openings in the inner wall and dimensioned and configured to receive an indexing projection; and
a card guide for mounting printed circuit boards and the like to the electronic equipment chassis, the card guide including:
an elongated card guide body having a card-receiving guideway on an inwardly facing side of the card guide body; and
a card guide mounting structure on an outwardly facing side of the card guide body, the card guide mounting structure including a pair of spaced apart mounting feet dimensioned to be inserted through the spaced apart openings in the inner wall of the electronic chassis;
wherein the indexing projection is provided on the card guide body intermediate and spaced from the mounting feet and engages the indexing opening once the mounting feet have been inserted through the inner openings thereby limiting relative movement between the card guide and the inner wall.

16. The chassis according to claim 15, wherein
the card guide body is resiliently flexible so that the card guide body can be bowed about a vertical axis and allow the mounting feet to be inserted into the inner openings in the wall of the chassis, wherein, once inserted, the card guide body resiliently springs to an extended position thereby trapping the mounting feet behind the inner wall of the chassis.

17. The chassis according to claim 15, wherein
the card guide is bowed inwardly in a relaxed state and whereby the card guide is flexed outwardly for insertion after which it resiliently springs inwardly to trap the mounting feet behind the inner wall of the chassis.

18. The chassis according to claim 15, wherein
the card guide body is resiliently flexible so that the card guide body can be bowed about a vertical axis and inserted into the spaced apart inner openings in the wall of the chassis, wherein, once inserted, the card guide body resiliently springs to an extended position thereby trapping the mounting feet behind the inner wall of the chassis.

19. The chassis according to claim 15, wherein
the card guide is bowed inwardly in a relaxed state and whereby the card guide is flexed outwardly for insertion, after which it resiliently springs inwardly to trap the mounting feet behind the inner wall of the chassis.

20. An electronic equipment chassis for supporting printed circuit boards and the like thereon, said chassis comprising:
an inner wall;
a pair of spaced apart inner openings in the inner wall;
a card guide for mounting printed circuit boards and the like to the electronic equipment chassis, the card guide including
an elongated card guide body having a card-receiving guideway on an inwardly facing side of the card guide body, an indexing projection on the card guide body formed to be inserted into indexing openings located intermediate to and spaced from the inner openings; and
a card guide mounting structure on an outwardly facing side of the card guide body, the card guide mounting structure including a pair of spaced apart mounting feet dimensioned to be inserted through the spaced apart openings in the inner wall of the electronic chassis;
an outer wall adjacent and parallel to the inner wall, the outer wall being longitudinally shiftable to the inner wall; and
a pair of spaced apart outer openings in the outer wall shifted from the inner openings, the outer openings having substantially the same dimensions and configuration as the inner openings;
wherein the mounting feet are trapped between the longitudinally shifted inner and outer openings in the inner and outer walls so that the feet hold the card guide between a sandwich configuration between the inner and outer walls.

21. The chassis according to claim 20, further comprising:
an inwardly extending projection extending from at least one of the ends; and
a projection opening located adjacent a respective one of the inner openings;
wherein the inwardly extending projection is dimensioned and configured to engage the projection opening to resiliently latch the card guide to the inner wall.

22. The chassis according to claim 20, wherein the mounting feet are L-shaped feet having ends extending substantially parallel with a longitudinal axis of the card guide body, further wherein the ends extend in the same direction and are dimensioned to be inserted through spaced apart mating openings in the inner wall of the housing.

23. The chassis according to claim 20, wherein the mounting feet are L-shaped feet having ends extending substantially parallel with a longitudinal axis of the card guide body, further wherein the ends extend in different directions and are dimensioned to be inserted through spaced apart mating openings in the inner wall of the housing.

* * * * *